United States Patent
Ng et al.

(10) Patent No.: US 6,172,400 B1
(45) Date of Patent: *Jan. 9, 2001

(54) MOS TRANSISTOR WITH SHIELD COPLANAR WITH GATE ELECTRODE

(75) Inventors: Sze Him Ng, Campbell; Francois Hebert, San Mateo, both of CA (US)

(73) Assignee: Spectrian Corporation, Sunnyvale, CA (US)

( * ) Notice: Under 35 U.S.C. 154(b), the term of this patent shall be extended for 0 days.

This patent is subject to a terminal disclaimer.

(21) Appl. No.: 09/139,532

(22) Filed: Aug. 25, 1998

Related U.S. Application Data

(62) Division of application No. 09/067,656, filed on Apr. 27, 1998.

(51) Int. Cl.$^7$ .................. H01L 29/76; H01L 29/94; H01L 31/62; H01L 31/113; H01L 31/119
(52) U.S. Cl. .................. 257/343; 257/409; 257/488; 257/340; 257/365; 257/331; 257/333
(58) Field of Search .................. 257/343, 409, 257/488, 340, 365, 331, 353

(56) References Cited

U.S. PATENT DOCUMENTS

| | | | |
|---|---|---|---|
| 4,288,801 | * 9/1981 | Ronen | 257/409 |
| 4,317,274 | * 3/1982 | Yasunari | 257/409 |
| 4,333,225 | * 6/1982 | Yeh | 257/343 |
| 4,616,340 | 10/1986 | Hayashi et al. | 365/185 |
| 4,928,159 | * 5/1990 | Mihara et al. | 257/327 |
| 5,237,186 | * 8/1993 | Nakagawa et al. | 257/343 |
| 5,311,052 | * 5/1994 | Stengl et al. | 257/488 |
| 5,382,826 | * 1/1995 | Mojaradi et al. | 257/489 |
| 5,384,476 | 1/1995 | Nishizawa et al. | 257/345 |
| 5,430,316 | * 7/1995 | Contierto et al. | 257/343 |
| 5,445,978 | 8/1995 | Yilmaz | 437/41 |
| 5,672,526 | 9/1997 | Kawamura | 437/41 R |
| 5,714,781 | 2/1998 | Yamamoto et al. | 257/329 |
| 5,726,463 | 3/1998 | Brown et al. | 257/77 |
| 5,834,809 | 11/1998 | Kato et al. | 257/335 |
| 5,912,490 | * 6/1999 | Hebert et al. | 257/409 |

FOREIGN PATENT DOCUMENTS

| | | | |
|---|---|---|---|
| 56-83076 | * 7/1981 | (JP) | 257/343 |
| 56-83077 | * 7/1981 | (JP) | 257/343 |
| 8-213479 | 8/1996 | (JP) . | |

OTHER PUBLICATIONS

Graf; Modern Dictionary of Electronics; p. 716, 1997.*

* cited by examiner

*Primary Examiner*—Mahshid Saadat
*Assistant Examiner*—Jesse A. Fenty
(74) *Attorney, Agent, or Firm*—Townsend and Townsend and Crew LLP; Henry K. Woodward

(57) ABSTRACT

A MOS transistor including a gate electrode on a gate oxide over a channel region between a source region and a drain region also includes a shield electrode at least partially on the gate oxide adjacent to, self-aligned with, and at least partially coplanar with the gate electrode and between the gate electrode and drain region. Placing the shield electrode on the gate oxide improves the gate-drain shielding, reduces the gate-drain capacitance, Cgd, and reduces hot electron related reliability hazard.

7 Claims, 11 Drawing Sheets

- Standard field oxidation
- Optional deep sinker realization for grounded source LDMOS device
- N-drain region formation (can be formed before or after field oxidation)

- Optional Sacrificial oxide (also used for implant screen oxide)
- Deep P+ implants (to improve device ruggedness)
- Gate oxidation (100 to 1000A typical, 500-700A preferred)

- Polysilicon deposition and doping (POC13 or ion implantation)
- Optional: polycide deposition to lower gate resistivity
- Poly mask: gate and shield formation
- P-channel mask, implant and drive-in

- N+ source/drain contact implant and anneal
- Dielectric deposition (BPSG with reflow preferred, or oxide/nitride stack)

- Contact mask and etch
- Metalization
- Passivation

- Standard field oxidation, nwell, and sinker process
- Pad oxidation (100 to 500Å thick) and nitride deposition (1000 to 3000Å)
- Bump mask, and nitride etch

- Bump oxidation (1000 to 8000A thick)
- nitride strip, pad oxide strip
- Optional Sacrificial oxide (also used for implant screen oxide)
- Deep P+ implants (to improve device ruggedness)
- Gate oxidation (100 to 1000A typical, 500-700A preferred)

- Polysilicon deposition, doping, and polycide formation
- Poly mask: gate and shield patterning
- Channel mask, implant, and drive-in

- N+ source/drain contact implant and anneal
- Dielectric deposition (BPSG with reflow preferred, or oxide/nitride stack)

- Contact mask and etch
- Metalization, metal mask, metal etch
- Passivation

- Standard field oxidation, nwell, and sinker process
- Bump oxidation (1000 to 8000A)
- Bump mask, bump etch (a combination of wet and dry etch to form a tapered step)

- P+ mask, Boron implant
- Gate oxidation, poly deposition
- Poly mask: gate and shield patterning
- Channel mask, implant, and drive-in

- N+ mask, source/drain implant, and drive-in
- Dielectric (e.g. BPSG) deposition, reflow

- Contact mask and etch
- Metalization, metal mask, metal etch
- Passivation

- same procedures as in Embodiment #1 up to poly mask
- nitride deposition, followed by a bump mask to define area for re-oxidation

- Re-oxidation of the drain region to form a raised shield
- Standard process from channel mask to passivation to get the final structure

MOS TRANSISTOR WITH SHIELD COPLANAR WITH GATE ELECTRODE

This application is a division of and claims the benefit of U.S. application Ser. No. 09/067,656, filed Apr. 27, 1998, the disclosure of which is incorporated by reference.

BACKGROUND OF THE INVENTION

This invention relates generally to metal-insulator-silicon field effect transistors (MISFETS), and more particularly the invention relates to a MISFET or MOSFET having a gate-drain shield positioned adjacent to and coplanar with the gate electrode.

The lateral double diffused metal-oxide-silicon field effect transistor (LDMOS) is used in power amplifiers for wireless applications such as in cellular telephones. The gate-to-drain feedback capacitance (Cgd or Crss) of any MOSFET device must be minimized in order to maximize RF gain and minimize signal distortion. $C_{gd}$ is critical since it is effectively multiplied by the voltage gain of the device as follows:

$$C_{effective} = C_{rss}(1 + gm\ R_L)$$

where gm is the transconductance and $R_L$ is the load impedance of the device.

Heretofore the use of a source field plate to improve breakdown characteristics have been proposed for use with a LDMOS transistor. See for example, Okabe et al U.S. Pat. No. 4,172,260 and Adler et al U.S. Pat. No. 5,252,848. In each of these structures the source electrode is extended over the gate electrode and insulated therefrom to provide a Faraday shield. However, such a shield over the gate electrode does not optimize the gate-drain capacitance, $C_{gd}$, since the shield does not effectively screen out the $C_{gd}$ component under the gate. Further, both structures require complex processing and are not suitable for use with vertical DMOS devices.

Weitzel U.S. Pat. No. 5,119,149 discloses a two-layered gallium arsenide structure and process in which a shield electrode is positioned adjacent to the gate but is not at the same level as the gate. Thus the gate-drain capacitance under the gate electrode is not optimally reduced. Also, the shield is not self-aligned to the gate and can cause variable shielding due to misalignment.

The present invention is directed to providing a lateral shield in an MOSFET power device including an extended drain MOSFET, a lateral DMOS transistor, and a vertical DMOS transistor using processes which are readily implementable.

SUMMARY OF THE INVENTION

In accordance with the present invention, the gate to drain feedback capacitance of a MOSFET device is reduced without increasing the input capacitance of the device. Reliability is improved by lowering the surface electric field at the gate and reducing hot carrier electron injection to the gate oxide. The linearity of the device can be modulated by voltage biasing a shield electrode adjacent to the gate electrode. Further, fabrication of the device permits low cost and simple processing.

Briefly, in a LDMOS transistor in which a gate electrode is formed on a gate oxide overlying a controlled channel between source and drain regions, a lateral shield is formed between the drain and gate with at least part of the shield formed on the gate oxide layer coplanar with the gate electrode. The shield can comprise the same material as the gate and can be fabricated in self-alignment with the gate to minimize and control shield to gate spacing. A typical shield length can be 0.5 to 5.0 microns with shield to gate spacing of 0.1 to 2.0 microns.

The shield electrode can be connected to AC ground for terminating an electric field from the drain and thereby decouple the gate electrode for reduced $C_{gd}$. Alternatively, the shield electrode can have a DC bias voltage to allow modulation of the device linearity.

The invention and objects and features thereof will be more readily apparent from the following detailed description and dependent claims when taken with the drawings.

DESCRIPTION OF THE PREFERRED EMBODIMENT

FIGS. 1A–1E are section views illustrating steps in fabricating a LDMOS with shield electrode in accordance with one embodiment of the invention.

Figure 1A:
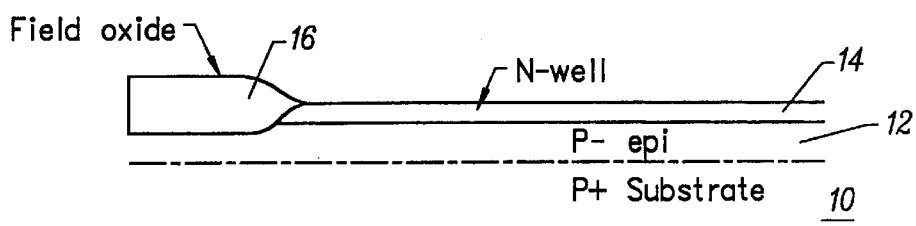
FIGS. 1A–1E are section views illustrating steps in fabricating a LDMOS transistor with shield electrode in accordance with one embodiment of the invention.

In FIG. 1A a p+ silicon substrate 10 has a p− epitaxial layer 12 formed there on with an N-doped well 14 formed in the epitaxial layer 12. A field oxide 16 is grown adjacent to the device region in the N well. Standard field oxidation is employed and an optional deep sinker can be realized for a grounded source LDMOS device. The N-drain region can be formed before or after the field oxidation.

Figure 1B:
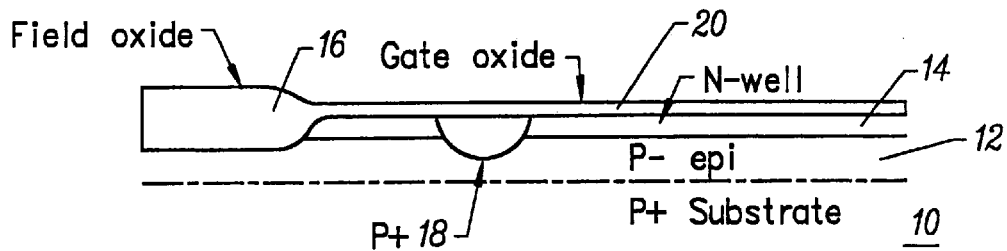

In FIG. 1B a deep P+ implant 18 is formed, and a gate oxide 20 is then grown on the device surface. The oxide can be on the order of 100 A to 1000 A with a thickness of 500–700 A preferred.

Figure 1C:
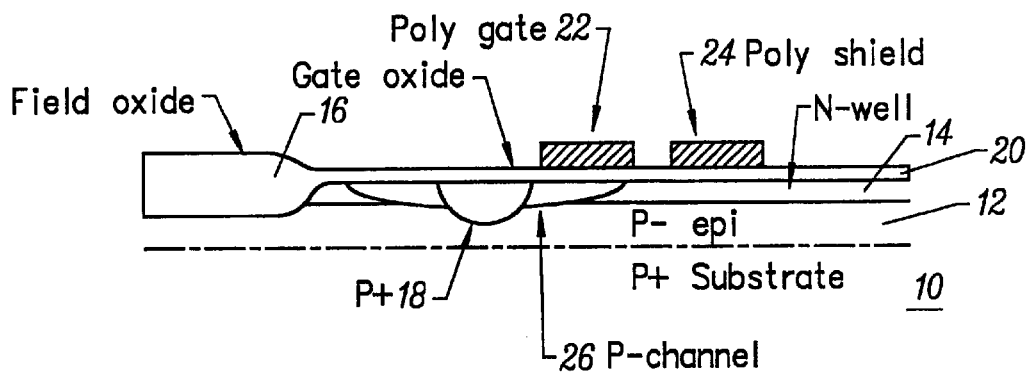

In FIG. 1C a polysilicon layer is deposited and doped by ion implantation or by diffusing a dopant such as $POCl_3$. A polycide deposition can be placed on the polysilicon to lower gate resistivity. The polysilicon layer is then masked with gate 22 and shield 24 formed by selective etchant. A P channel mask, implant and drive-in form the channel region 26.

Figure 1D:
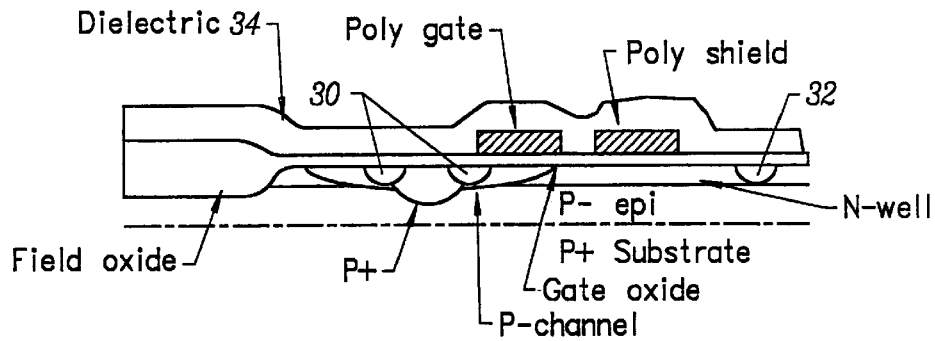
Figure 1E:
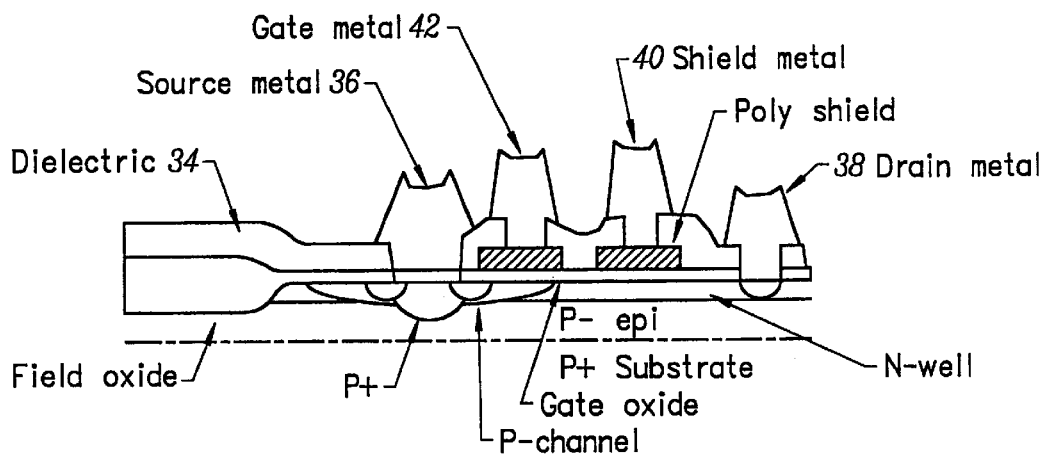

Thereafter, as shown in FIG. 1D, N+ source region 30 and drain region 32 are implanted and annealed, and then a dielectric deposition 34 is formed over the surface of the device. The dielectric is preferably BPSG with reflow preferred, or an oxide/nitride stack. The device is completed as shown in FIG. 1E by using a contact mask and etch followed by metalization to form the source metal 36, drain metal 38, shield metal 40, and gate metal 42. In this embodiment the shield electrode and gate electrode are both formed on the gate oxide layer 20.

Figure 2:
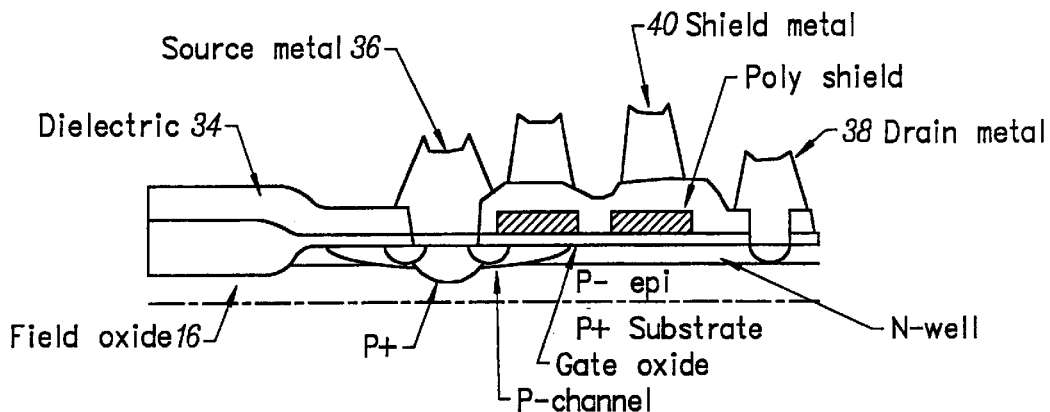
FIG. 2 is a section view of another embodiment of the LDMOS transistor structure.

In a process similar to that illustrated in FIGS. 1A–1E, a polycide stack such as tungsten silicide on polysilicon can be used for the gate and shield electrodes. As shown in the cross section of FIG. 2, this eliminates the need for gate metal and metal contact to the polysilicon gate. Further, no critical alignment of contact and metal to the polysilicon layer is required. Tighter geometry and shorter gate lengths are realized.

Figure 3A:
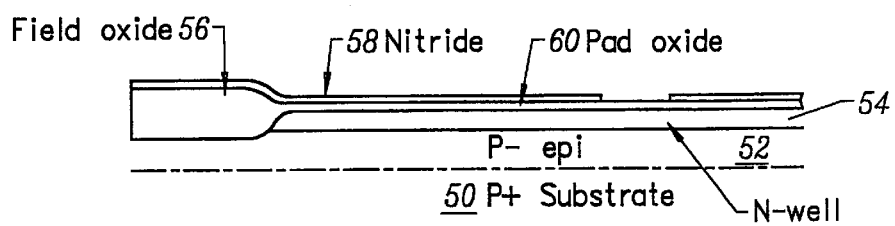
FIGS. 3A–3E are section views illustrating steps in fabricating a LDMOS with shield electrode in accordance with another embodiment of the invention.

FIGS. 3A–3E are section views illustrating another embodiment of the invention in which the shield electrode is situated on a graded oxide step formed in a LOCOS process. The gate side of the shield electrode is on the thin gate oxide for effective shielding while the drain side of the shield is on thick LOCOS oxide. Such a structure has the advantages of higher breakdown voltage and improved device reliability by lowering the surface electric field at the shield and thereby reducing any hot carrier injection of the shield. In FIG. 3A a P+ silicon substrate 50 again has a P− epitaxial layer, 52 thereon with and n-well 54 formed in the epi layer. Field oxide 56 is formed adjacent to the device region, and the surface of the device region is covered by a nitride layer 58 over a pad oxide 60 on the surface of N-well 54.

Figure 3B:
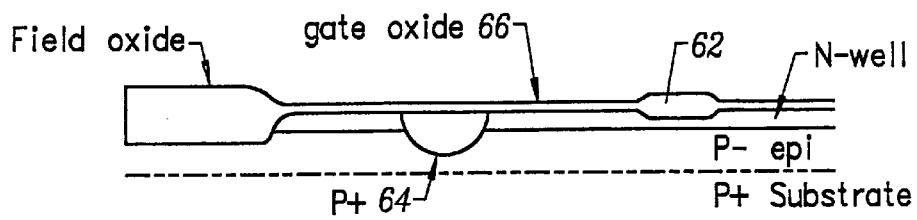

In FIG. 3B a bump oxidation 62 is grown through the pad oxide to a thickness of 1000 to 8000 A, and the nitride and pad oxide are then stripped. A deep P+ implant 64 is formed to improve device ruggedness, and gate oxide 66 is then grown on the surface of the N-well to a thickness of 100 to 1000 A.

Figure 3C:
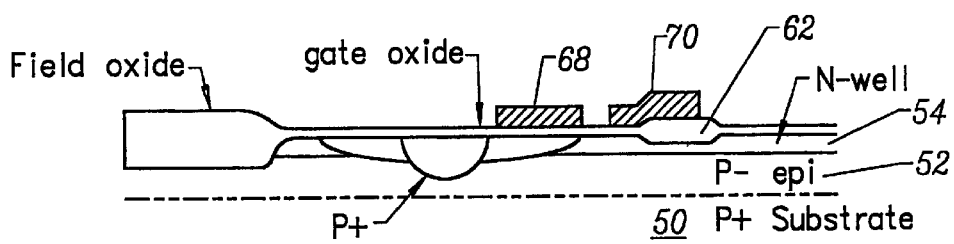

In FIG. 3C a polysilicon layer is deposited and doped, with polycide optionally formed there over. The polysilicon layer is then masked and etched to form the gate electrode 68 and shield electrode 70 formed on the graded oxide.

Figure 3D:
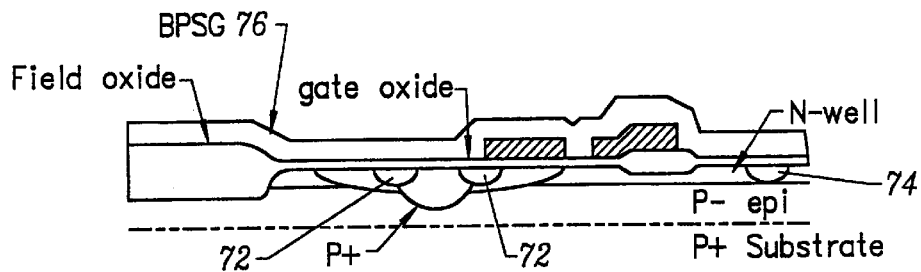
Figure 3E:
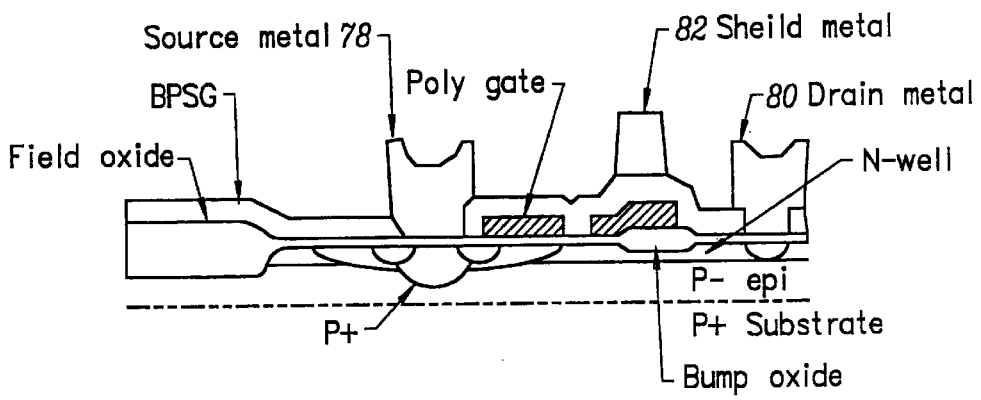

In FIG. 3D the N+ source 72 and drain 74 are implanted and annealed and then a dielectric deposition 76 (BPSG with reflow preferred, or oxide/nitride stack) is formed over the surface of the device. Finally, as shown in FIG. 3E source metal 78, drain metal 80, shield metal 82 are then formed.

FIGS. 4A–4D are section views illustrating another process in forming a shield electrode on a graded oxide step. In this embodiment a thick oxide is grown and etched, and later a thin gate oxide is regrown. This process results in higher drain break-down voltage and improved device reliability by lowering the surface electric field at the shield thereby reducing any hot carrier injection to the shield.

Figure 4A:
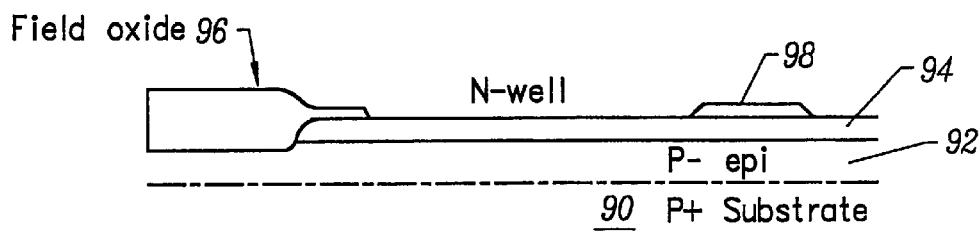
FIGS. 4A–4D are section views illustrating steps in fabricating a LDMOS with shield electrode in accordance with yet another embodiment of the invention.

In FIG. 4A a P+ substrate 90 with a P− epitaxial layer 92 are again provided and an N-well 94 is formed in the surface of the epi layer. Field oxide 96 is formed by LOCOS process and then bump oxide 98 (1000 to 8000 A) is grown on the N-well 94. The bump mask and bump etch uses a combination of isotropic and anisotropic to form a tapered step on the sides of the bump.

Figure 4B:
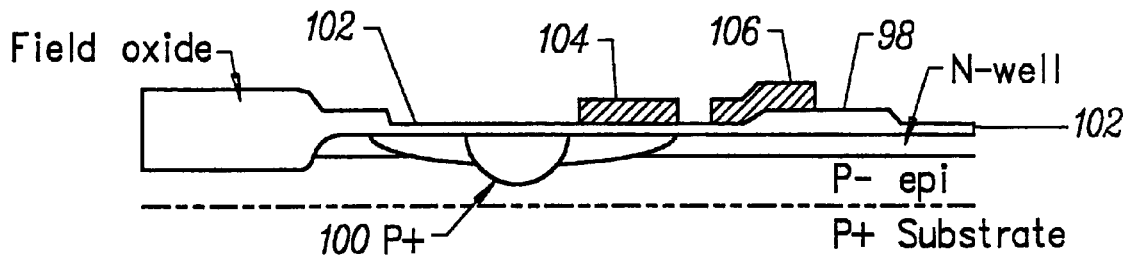

Next, as shown in FIG. 4B a P+ mask and Boron implant forms the deep P+ implant 100 followed by growth of gate oxide 102 and polysilicon deposition. A subsequent mask and etch form the gate electrode 104 on gate oxide 102 and the shield electrode 106 an gate oxide 102 and on bump oxide 98.

Figure 4C:
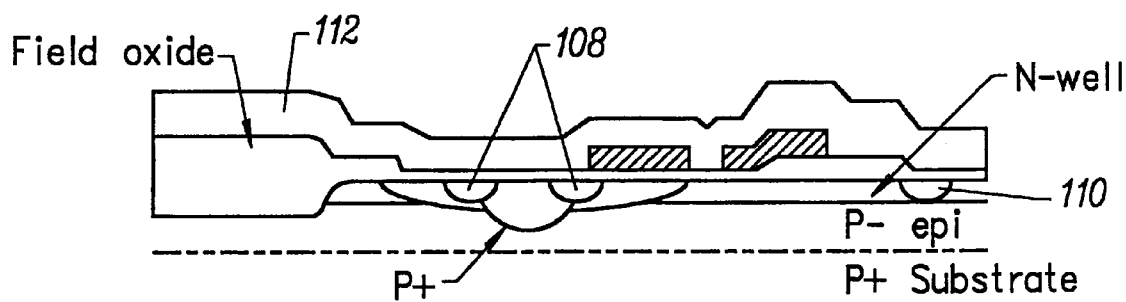

In FIG. 4C source region 108 and drain region 110 are implanted using an N+ mask and then driven in, and a dielectric 112 (BPSG) is deposited and reflowed.

Figure 4D:
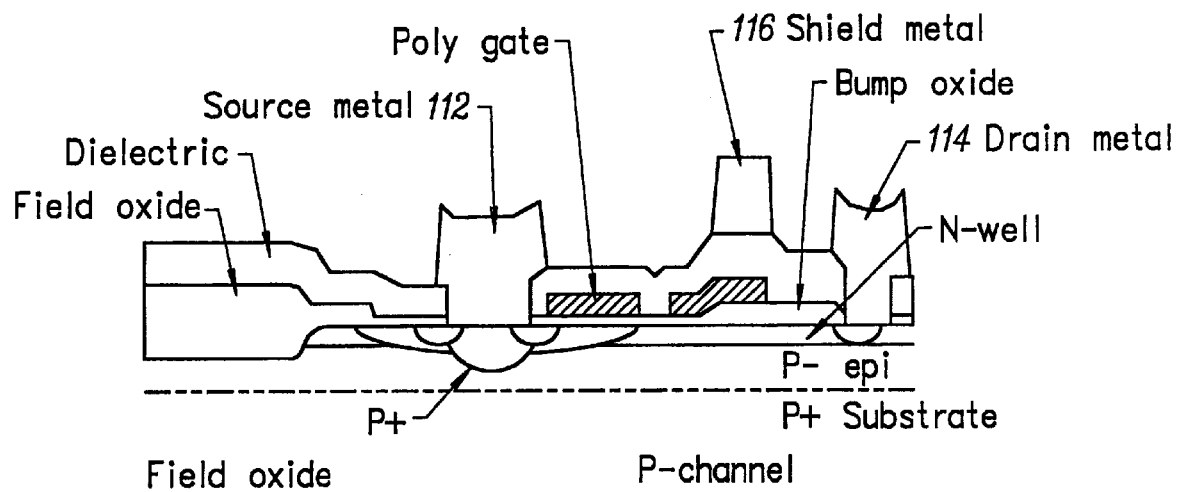

Finally in FIG. 4D a contact mask and etch is followed by metalization, metal mask, and metal etch to form the source metal 112, drain metal 114, and shield metal 116.

Figure 5A:
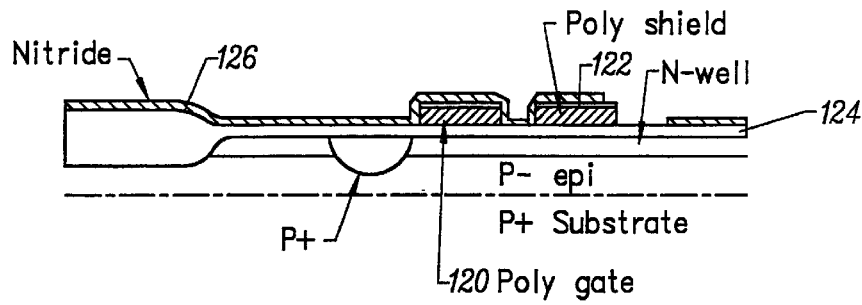
FIGS. 5A–5C are section views illustrating steps in fabricating a LDMOS with shield electrode in accordance with another embodiment of the invention.
Figure 5B:
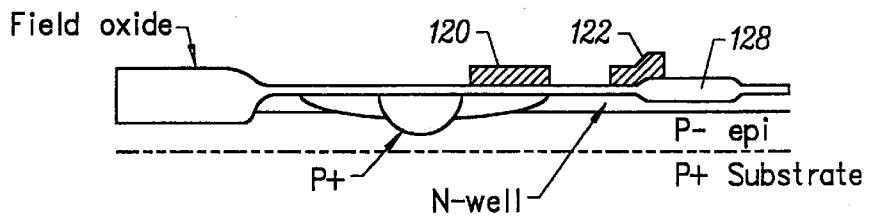
Figure 5C:
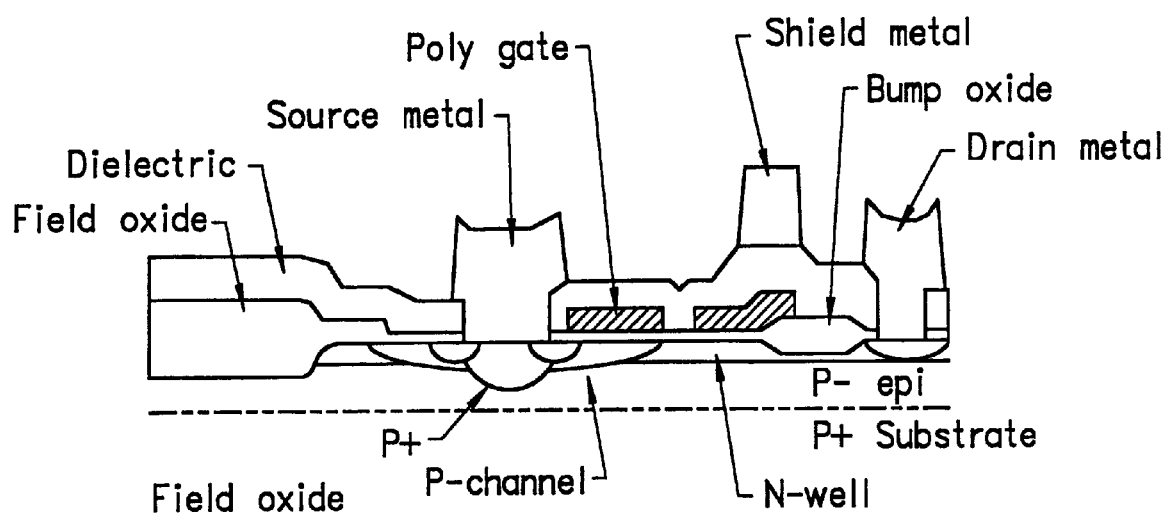

FIGS. 5A–5C are section views illustrating steps in fabricating another embodiment of a LDMOS transistor with a shield electrode situated on a graded oxide formed by re-oxidation of the drain region after formation of the gate and the shield. This process has the advantages of providing self-aligned oxide under the shield edge and higher drain breakdown voltage. Device reliability is improved by lowering the surface electric field at the shield and thereby reducing any hot carrier injection to the shield.

In FIG. 5A using the same procedure as described for FIGS. 1A–1C, the polysilicon shield gate 120 and shield electrode 122 are formed on the gate oxide 124, and a nitride layer 126 is then deposited followed by a bump mask to define an area for re-oxidation adjacent to the polysilicon shield electrode 122.

As shown in FIG. 5B, the drain region of the device is re-oxidized at 128 to form a raised shield 122. The standard processing from channel mask to passivation as described above then provides the finished structure as shown in FIG. 5C.

The use of a self-aligned shield electrode adjacent to the gate electrode and at least portionally positioned on the gate oxide further reduces Cgd without increasing the input capacitance. As described, low cost and simply processing is employed in fabricating the several different embodiments of the invention. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A MOS transistor comprising:
   a) a silicon substrate of one conductivity type,
   b) a well region of a second conductivity type in a surface of the substrate,
   c) source region and a channel region in the well region,
   d) a gate oxide layer on the surface of the well region,
   e) a gate electrode on the gate oxide layer with at least a portion of the gate electrode being over the channel region, and
   f) a shield electrode on the gate oxide layer adjacent to and spaced from the gate electrode and at least partially coplanar with the portion of the gate electrode over the channel.

2. The MOS transistor as defined by claim 1 and further including a drain region separated from the source region by the channel region.

3. The MOS transistor as defined by claim 2 wherein the drain region is in the well region, the shield electrode being positioned between the gate electrode and the drain region.

4. The MOS transistor as defined by claim 3 wherein the oxide layer under the shield electrode is thicker adjacent to the drain region than the oxide layer adjacent the channel region.

5. The MOS transistor as defined by claim 4 and further including a metal electrode contacting the source region and a metal electrode contacting the drain region.

6. The MOS transistor as defined by claim 5 and further including a metal electrode contacting the shield electrode.

7. The MOS transistor as defined by claim 6 and further including a passivating dielectric layer over the surface of the transistor.

* * * * *